(12) United States Patent
Ishii

(10) Patent No.: US 6,796,268 B2
(45) Date of Patent: Sep. 28, 2004

(54) MICROWAVE PLASMA PROCESSING SYSTEM

(75) Inventor: Nobuo Ishii, Osaka (JP)

(73) Assignees: Tokyo Electron Limited, Tokyo-to (JP); Yasuyoshi Yasaka, Kyoto-fu (JP); Makoto Ando, Kanagawa-Ken (JP)

( * ) Notice: Subject to any disclaimer, the term of this patent is extended or adjusted under 35 U.S.C. 154(b) by 0 days.

(21) Appl. No.: 09/776,675

(22) Filed: Feb. 6, 2001

(65) Prior Publication Data

US 2001/0011525 A1 Aug. 9, 2001

(30) Foreign Application Priority Data

Feb. 7, 2000 (JP) .......................................... 2000-029248

(51) Int. Cl.$^7$ .............................................. C23C 16/00
(52) U.S. Cl. ........................ 118/723 MW; 156/345.41
(58) Field of Search ................................ 118/723 MW, 118/723 MR, 723 AN, 723 I, 723 ME, 723 MA; 156/345.41, 345.48, 345.42, 345.36

(56) References Cited

U.S. PATENT DOCUMENTS

| | | | | |
|---|---|---|---|---|
| 4,893,584 A | * | 1/1990 | Doehler et al. | 118/723 MW |
| 5,134,965 A | * | 8/1992 | Tokuda et al. | 118/723 |
| 5,359,177 A | * | 10/1994 | Taki et al. | 219/121.43 |
| 5,370,765 A | * | 12/1994 | Dandl | 216/69 |
| 5,538,699 A | * | 7/1996 | Suzuki | 422/186.29 |
| 5,874,706 A | * | 2/1999 | Ishii et al. | 219/121.43 |
| 5,983,829 A | * | 11/1999 | Suzuki | 118/723 MW |
| 6,076,484 A | * | 6/2000 | Matsumoto et al. | 118/723 MW |
| 6,158,383 A | * | 12/2000 | Watanabe et al. | 118/723 AN |

FOREIGN PATENT DOCUMENTS

| | | | |
|---|---|---|---|
| EP | 0880164 A1 | * | 11/1998 |
| JP | 11121196 A | * | 4/1999 |
| JP | 11243000 A | * | 9/1999 |
| JP | 11329792 A | * | 11/1999 |

* cited by examiner

*Primary Examiner*—Gregory Mills
*Assistant Examiner*—Michelle Crowell
(74) *Attorney, Agent, or Firm*—Finnegan, Henderson, Farabow, Garrett & Dunner, L.L.P.

(57) ABSTRACT

On the top wall of a processing vessel 1 of a plasma processing system, a transmission window 10 capable of transmitting microwaves is provided. On the top of the transmission window 10, a microwave antenna 2 is mounted. Microwaves are supplied from a microwave supply source 3 to the antenna 2 through a connecting waveguide 4. The antenna 2 has two ring-shaped antenna waveguides 5a and 5b which are substantially concentrically arranged. Each of the antenna waveguides 5a and 5b comprises a rectangular waveguide having a bottom wall in which a plurality of slots 6a and 6b are formed at intervals, and the proximal end portion of each of the antenna waveguides 5a and 5b is connected to the connecting waveguide 4. The proximal end portions 7a and 7b of the antenna waveguides 5a and 5b are provided with control gates 9a and 9b for varying the size of apertures, respectively.

18 Claims, 4 Drawing Sheets

MICROWAVE PLASMA PROCESSING SYSTEM

BACKGROUND OF THE INVENTION

1. Field of the Invention

The present invention relates generally to a microwave plasma processing system which is designed to produce plasma in a processing vessel by microwaves introduced from an antenna. More specifically, the invention relates to the improvement of a wave guiding structure of the antenna.

2. Description of the Related Art

FIG. 5 shows an example of a conventional microwave plasma processing system. The microwave plasma processing system shown in FIG. 5 comprises a processing vessel 1 having a transmission window 10 capable of transmitting microwaves. On the top of the transmission window 10 of the processing vessel 1, a microwave antenna 102 is mounted.

The antenna 102 serves as a thin cylindrical waveguide, and the bottom thereof is formed with a plurality of slots 106 which are appropriately distributed. The central portion of the antenna 102 is connected to a coaxial line 104. The coaxial line 104 comprises an inner conductor 104a and an outer conductor 104b. Through the coaxial line 104, microwaves are supplied to the antenna 102 from a microwave supply source (not shown).

The microwaves supplied to the antenna 102 through the coaxial line 104 are radiated downwards from the slots 106 while being propagated outwardly in radial directions from the central portion of the antenna 102. When the microwaves reflect on the outer peripheral portion of the antenna 102 to be returned, the microwaves traveling outwardly and inwardly in radial directions interfere with each other to produce standing waves.

The microwave plasma processing system shown in FIG. 5 comprises a supporting table 12 provided on the bottom of the processing vessel 1. In the bottom of the processing vessel 1 corresponding to the surrounding of the supporting table 12, an exhaust port 13 for evacuating the interior of the processing vessel 1 is formed. At an appropriate position in the upper portion of the processing container 1, an introducing pipe 14 for introducing a process gas or the like is provided.

The microwave plasma processing system is designed to produce the plasma of the process gas with microwaves, which are introduced from (the slots 106 of) the antenna 102, in the processing vessel 1 which is held at a predetermined degree of vacuum. With the produced plasma, various intended plasma processes, such as deposition or etching processes, can be carried out with respect to an object W to be processed (e.g., a semiconductor wafer or a LDC substrate) on the supporting table 12.

In the above-described microwave plasma processing system, there is the following problem. That is, because of the structure that microwaves are radially propagated in the antenna 102, the radial distribution of the microwaves introduced into the processing vessel 1 from the antenna 102 is difficult to be uniform. For that reason, there is a problem in that the uniformity of the plasma processing for the object W to be processed in the processing vessel 1 decreases.

In accordance with processing conditions, there are some cases where it is not the best to simply obtain the radially uniform intensity of microwaves in the antenna 102 in order to improve the uniformity of the plasma process with respect to the object W to be processed. In such cases, it is required that the radial distribution of microwaves introduced into the processing vessel from the antenna can be optimally set in accordance with processing conditions.

SUMMARY OF THE INVENTION

It is therefore an object of the present invention to eliminate the aforementioned problems and to provide a microwave plasma processing system capable of optimally setting the radial distribution of microwaves, which are introduced into a processing vessel from an antenna, in accordance with processing conditions.

In order to accomplish the aforementioned and other objects, according to the present invention, there is provided a microwave plasma processing system comprising: a processing vessel; an antenna for introducing microwaves into the processing vessel; a microwave supply source for supplying the microwaves to the antenna; and a connecting waveguide for connecting the microwave supply source to the antenna, wherein a plasma is produced in the processing vessel by the microwaves introduced from the antenna, the antenna having a plurality of substantially ring-shaped antenna waveguides which are substantially concentrically arranged, each of the antenna waveguides comprising a rectangular waveguide having a wall in which a plurality of slots are formed at intervals, the proximal end portion of each of the antenna waveguides being connected to the connecting waveguide.

According to the present invention, there is also provided a microwave plasma processing system comprising: a processing vessel having a microwave transmittable top wall; an antenna mounted on the top wall of the processing vessel; a microwave supply source for supplying said microwaves to the antenna; and a connecting waveguide for connecting the microwave supply source to the antenna, wherein a plasma is produced in the processing vessel by the microwaves introduced from the antenna, the antenna having a plurality of substantially ring-shaped antenna waveguides which are substantially concentrically arranged, each of the antenna waveguides comprising a rectangular waveguide having a bottom wall in which a plurality of slots are formed at intervals, the proximal end portion of each of the antenna waveguides being connected to the connecting waveguide.

According to these plasma processing systems, it is possible to change the intensity of microwaves by adjusting the dimension of the cross section of each of the antenna waveguides and adjusting the dimension of each of the slots and the interval between adjacent slots every antenna waveguide. Therefore, the radial distribution of microwaves introduced into the processing vessel from the antenna can be optimally set in accordance with processing conditions. Thus, for example, it is possible to remarkably improve the uniformity of a plasma process in the processing vessel.

In the above-described plasma processing systems, at least one of the antenna waveguides of the antenna is preferably provided with aperture variable device for varying the size of an aperture at the proximal end portion. Thus, the intensity of microwaves distributed to a corresponding one of the antenna waveguides can be adjusted by varying the dimension of the aperture in the proximal end portion of the corresponding antenna waveguide by the aperture variable device. Therefore, the radial distribution of microwaves introduced into the processing vessel from the antenna can be freely changed in accordance with the variation in process conditions.

The terminal end portion of each of the antenna waveguides of the antenna may be closed with a conductor or a microwave absorber.

The connecting waveguide may extend to the proximal end portion of the innermost one of the antenna waveguides in a substantially radial direction with respect to each of the antenna waveguides. In such a case, the terminal end portion of the connecting waveguide may be closed with a conductor or a microwave absorber.

BRIEF DESCRIPTION OF THE DRAWINGS

The present invention will be understood more fully from the detailed description given hereafter and from the accompanying drawings of the preferred embodiments of the invention. However, the drawings are not intended to imply limitation of the invention to a specific embodiment, but are for explanation and understanding only.

In the drawings:

FIG. 4b is a longitudinal sectional view schematically showing a principal part of an antenna of the system shown in FIG. 4a.

DESCRIPTION OF THE PREFERRED EMBODIMENTS

Referring now to the accompanying drawings, the preferred embodiments of the present invention will be described below. FIG. 1a through FIG. 4b show the preferred embodiments of a microwave plasma processing system according to the present invention. In the preferred embodiments shown in FIGS. 1a through 4b, the same reference numbers are given to the same elements as those in the conventional example shown in FIG. 5.

First Preferred Embodiment

Figure 1A:
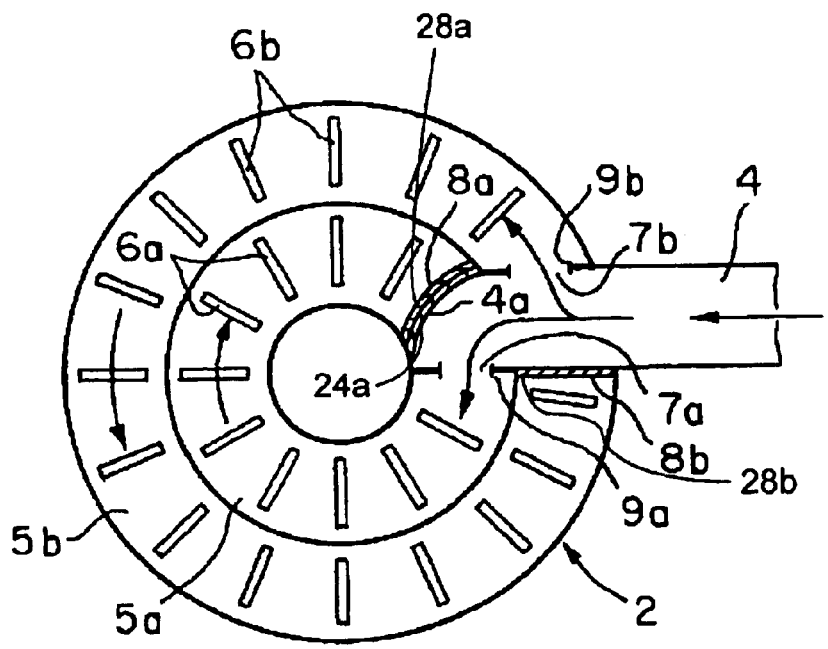
FIG. 1a is a horizontal sectional view of an antenna, which schematically shows the first preferred embodiment of a microwave plasma processing system according to the present invention.
Figure 1B:
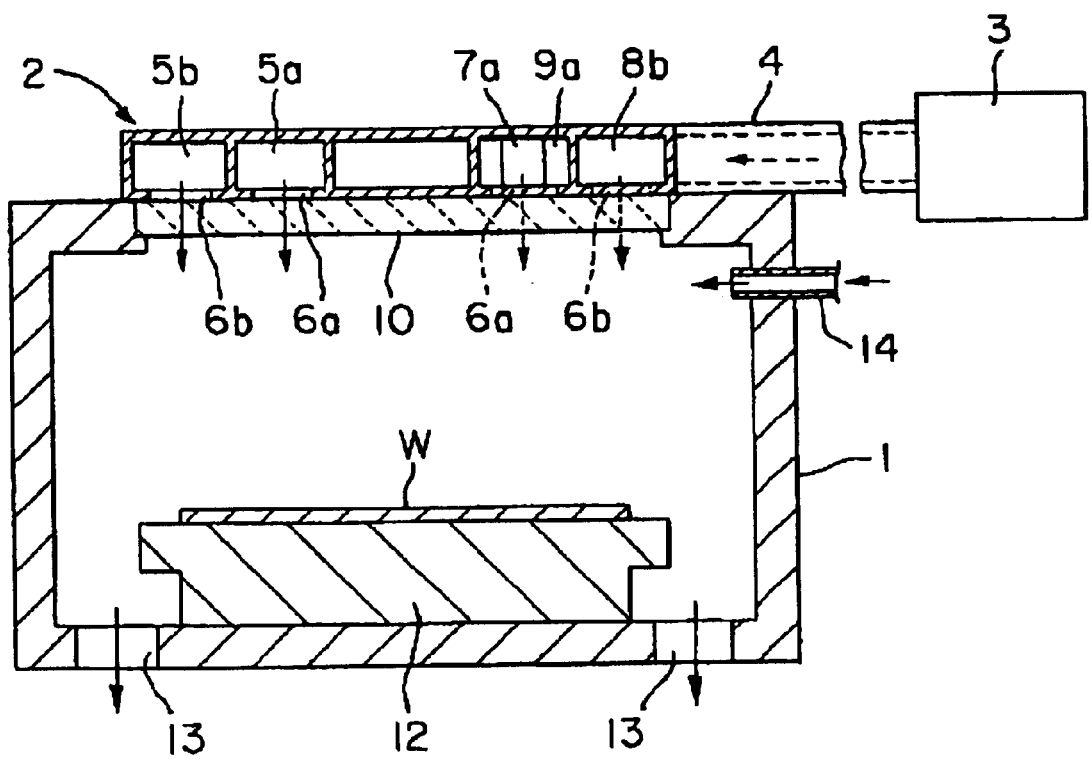
FIG. 1b is a longitudinal sectional view schematically showing the system shown in FIG. 1a as a whole.
Figure 2:
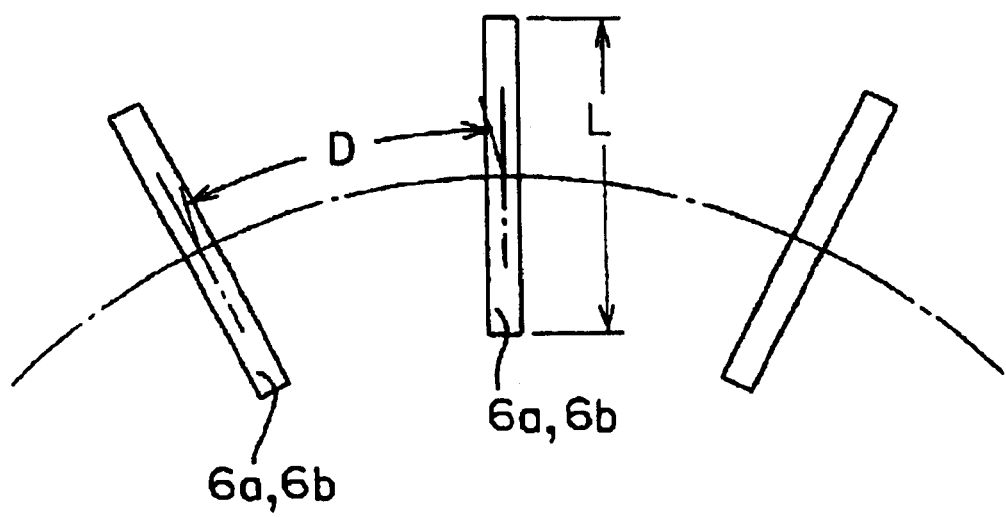
FIG. 2 is an enlarged view showing a part of slots in the antenna shown in FIG. 1b.

Referring to FIGS. 1a, 1b and 2, the first preferred embodiment of a microwave plasma processing system according to the present invention will be described below.

Construction

In FIG. 1b, the microwave plasma processing system in this preferred embodiment comprises a substantially cylindrical metal processing vessel 1. On the top wall of the processing vessel 1, a transmission window 10 of a microwave transmittable dielectric, e.g. quartz, is provided. On the top of the transmission window 10 of the processing vessel 1, a microwave antenna 2 is mounted.

The plasma processing system further comprises a microwave supply source 3 for supplying microwaves to the antenna 2, and a connecting waveguide 4 for connecting the microwave supply source 3 to the antenna 2. The microwave supply source 3 comprises a microwave oscillator for oscillating microwaves of, e.g., 2.45 GHz. The connecting waveguide 4 comprises, e.g., a single rectangular waveguide.

As shown in FIGS. 1a and 1b, the antenna 2 has two ring-shaped antenna waveguides 5a and 5b which are substantially concentrically arranged. In the following preferred embodiment, the use of an antenna having a double-waveguide structure of such two substantially ring-shaped antenna waveguides which are substantially concentrically arranged will be described. However, the present invention should not be limited thereto, but an antenna having a multiple-waveguide structure of three or more substantially ring-shaped antenna waveguides which are substantially concentrically arranged may be used. The descriptions in the case of three or more antenna waveguides will be hereinafter shown with mark ※.

Each of the antenna waveguides 5a and 5b is formed by a rectangular waveguide, the bottom wall (H-plane) of which is formed with a plurality of slots 6a or 6b, and the proximal end (mouth) portions 7a and 7b thereof are connected to the connecting waveguide 4. The connecting waveguide 4 extends to the proximal end portion 7a of the innermost antenna waveguide 5a substantially radially with respect to the antenna waveguides 5a and 5b. The terminal end portion 4a of the connecting waveguide 4 is closed with a microwave absorber 24a.

The terminal end portions 8a and 8b of the antenna waveguides 5a and 5b are closed at the side portions of the connecting waveguide 4 with microwave absorbers 28a and 28b, respectively. In the proximal end portions 7a and 7b of the antenna waveguides 5a and 5b, aperture size variable control gates (aperture variable device) 9a and 9b are provided.

As shown in FIG. 1b, the plasma processing system further comprises a supporting table 12 which is provided on the bottom of the processing vessel 1. In the bottom of the processing vessel 1 corresponding to the surrounding of the supporting table 12, an exhaust port 13 for evacuating the interior of the processing vessel 1 is formed. At an appropriate position in the upper portion of the processing vessel 1, an introducing pipe 14 for introducing a process gas or the like is provided.

Microwaves supplied from the microwave supply source 3 to the antenna 2 through the connecting waveguide 4 are introduced from the proximal end portions 7a and 7b of the respective antenna waveguides 5a and 5b through the apertures of the control gates 9a and 9b. The introduced microwaves are radiated downwards from the respective slots 6a and 6b (or leaked as an evanescent field) while being propagated in the respective antenna waveguides 5a and 5b in circumferential directions (clockwise and counterclockwise, respectively).

The microwave plasma processing system is designed to produce the plasma of the process gas with the microwaves, which are introduced from (the slots 6a and 6b of) the antenna 2, in the processing vessel 1 which is held at a predetermined degree of vacuum. With the produced plasma, various intended plasma processes, such as deposition or etching processes, can be carried out with respect to an object W to be processed (e.g., a semiconductor wafer) on the supporting table 12.

The dimension of the slots 6a and 6b of the respective antenna waveguides 5a and 5b constituting the antenna 2 will be described herein. In FIG. 2, assuming that a guide-wavelength of microwaves is λ, the width L of each of the slots 6a and 6b is generally set to be its half-wave length (λ/2) or less. The interval D between circumferentially adjacent slots 6a and 6b can be optionally in the range of the guide-wavelength λ or less.

Although the setting of the slot interval D is strictly determined by the guide-wavelength and a wavelength in vacuum, it can be substantially classified into the following (1) through (3).

(1) The slot interval D is set to be equal to the guide-wavelength λ. In this case, microwaves are radiated as electromagnetic waves in a direction perpendicular to the bottom wall of the antenna 2 (the respective antenna waveguides 5a and 5b).
(2) The slot interval D is set to be shorter than the guide-wavelength λ and longer than the half guide-wavelength (λ/2). In this case, microwaves are radiated as electromagnetic waves mainly in the opposite direction to their traveling direction and in a direction acute to the bottom wall of the antenna 2 (the respective antenna waveguides 5a and 5b).
(3) The slot interval D is set to be the half guide-wavelength (λ/2) or less. In this case, microwaves form an evanescent field without being radiated as electromagnetic waves.

Functions and Effects

With such constructions, the functions and effects of this preferred embodiment will be described below.

According to this preferred embodiment, the intensity of microwaves can be changed by adjusting the size of the guide cross-section and the dimension and interval of the slots 6a and 6b of the respective antenna waveguides 5a and 5b. Therefore, the radial distribution of microwaves introduced into the processing vessel 1 from the antenna 2 can be optimally set in accordance with processing conditions. Thus, for example, the uniformity of the plasma processing in the processing vessel 1 can be remarkably improved.

By changing the aperture size of the proximal end portions 7a and 7b of the antenna waveguides 5a and 5b by the control gates 9a and 9b, the intensity of microwaves distributed to the corresponding antenna waveguides 5a and 5b can be adjusted. Therefore, the radial distribution of microwaves introduced into the processing vessel 1 from the antenna 2 can be freely changed in accordance with the variation in processing conditions and so forth.

The intensity of microwaves distributed to each the inside and outside antenna waveguides 5a and 5b is generally set so that the intensity of microwaves distributed to the outside antenna waveguide 5b is equal to or greater than that to the inside antenna waveguide 5a, as in the range of, e.g., from 50:50 to 25:75. This corresponds to the fact that the sectional area per unit radial length increases as the radius increases.

Modified Examples

In this preferred embodiment, while the terminal end portion 4a of the connecting waveguide 4 has been closed with the microwave absorber 24a, the terminal end portion 4a may be closed with a conductor. In such a case, microwaves in the connecting waveguide 4 reflect on the terminal end portion 4a to form standing waves. Therefore, in order to adjust the phase of microwaves in the connecting waveguide 4 with respect to each of the antenna waveguides, the following setting of dimension is carried out.

That is, the central position of the proximal end portion 7a (gate position) in the inside antenna waveguide 5a (※ the innermost antenna waveguide) is set to be radially spaced from the central position of the terminal end portion 4a of the connecting waveguide 4 by a distance [n times as long as the half guide-wavelength (λ/2) plus the quarter guide-wavelength (λ/4) . . . n(λ/2)+λ/4 . . . , where n is 0 or a natural number (which is hereinafter the same)]. The central position of the proximal end portion 7b in the external antenna waveguide 5b (※ the second and subsequent antenna waveguide from the inside) is set to be radially spaced from the central position of the proximal end portion 7a of the inside antenna waveguide 5a (※ the innermost antenna waveguide) by a distance [a natural number times as long as the half guide-wavelength (λ/2)].

In this preferred embodiment, while the terminal end portions 8a and 8b of the respective antenna waveguides 5a and 5b have been closed with the microwave absorbers 28a and 28b, the terminal end portions 8a and 8b may be closed with conductors. In such a case, microwaves in the respective antenna waveguides 5a and 5b reflect on the terminal end portions 8a and 8b to form standing waves, respectively. Therefore, the length of each of the antenna waveguides 5a and 5b is set to be ]n(λ/2)+λ/4] to adjust the phase of microwaves.

Second Preferred Embodiment

The second preferred embodiment of a microwave plasma processing system according to the present invention will be described below.

This preferred embodiment is substantially the same as the first preferred embodiment shown in FIGS. 1 and 2, except that the control gate 9a of the inside waveguide 5a (※ the innermost antenna waveguide) in the first preferred embodiment is omitted. Therefore, referring to FIG. 1a, this preferred embodiment will be described without the need of another figure.

Also in this preferred embodiment, the terminal end portions 8a and 8b of the respective antenna waveguides 5a and 5b may be closed with the microwave absorbers 28a and 28b or the conductors. In the case of the conductors, microwaves in the respective antenna waveguides 5a and 5b reflect on the terminal end portions 8a and 8b to form standing waves, respectively. Therefore, the length of each of the antenna waveguides 5a and 5b is set to be ]n(λ/2)+λ/4] to adjust the phase of microwaves.

In the case of the conductors, the central position of the proximal end portion 7b (gate position) in the outside antenna waveguide 5b (※ the second antenna waveguide from the inside) is set to be radially spaced from the central portion of the terminal end portion 7a (gate position) of the inside antenna waveguide 5a (※ the innermost antenna waveguide) by a distance [a natural number times as long as the half guide-wavelength (λ/2)]. (※ With respect to the second and subsequent antenna waveguides from the inside, the distance between the centers (the distance between the gates) of the proximal end portions of adjacent antenna waveguides is set to be a distance [a natural number times as long as the half guide-wavelength (λ/2)].)

In this preferred embodiment, by changing the aperture size of the proximal end portion 7b of the outside antenna waveguide 5b (※ the second and subsequent antenna waveguides from the inside) by the control gate 9b, the intensity of microwaves distributed to the respective antenna waveguides 5a and 5b can be adjusted. In this case, the intensity of microwaves distributed to the inside antenna waveguide 5a (※ the innermost antenna waveguide) is the residual intensity which is obtained by subtracting the intensity of microwaves distributed to the outside antenna waveguide 5b (※ the second and subsequent antenna waveguides from the inside).

Third Preferred Embodiment

Figure 3:
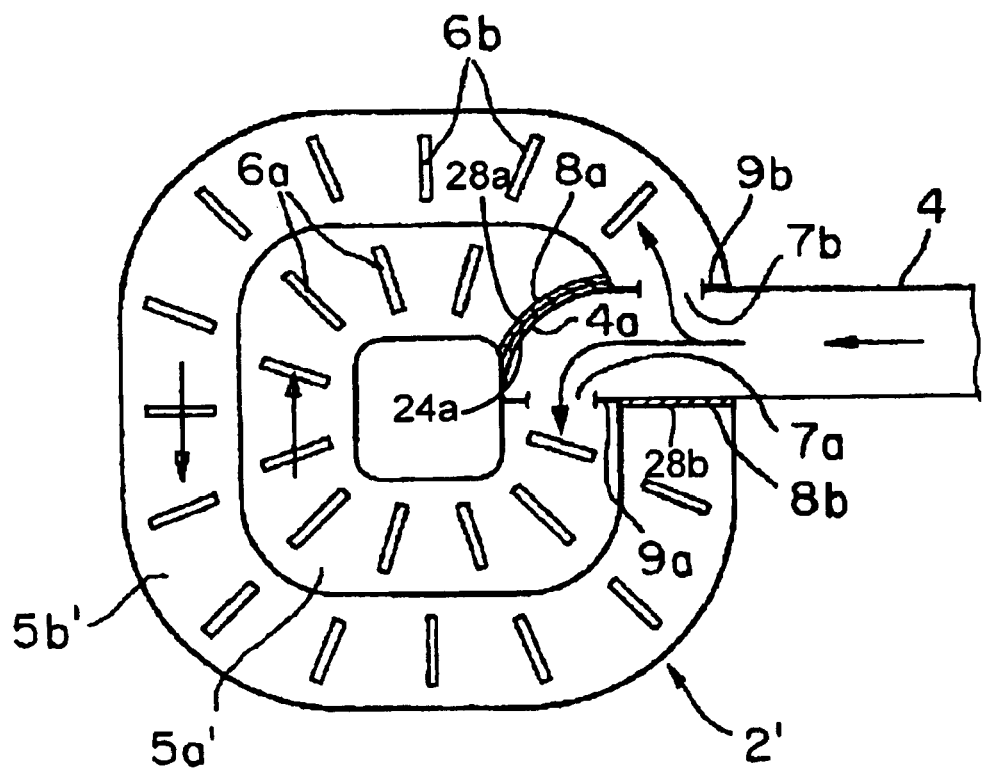
FIG. 3 is a horizontal sectional view of an antenna portion, which schematically shows the third preferred embodiment of a microwave plasma processing system according to the present invention.

Referring to FIG. 3, the third preferred embodiment of the present invention will be described below.

This preferred embodiment is substantially the same as the above-described first preferred embodiment, except that an antenna 2' shown in FIG. 3 is substituted for the antenna 2 in the above-described first preferred embodiment.

In this preferred embodiment, the antenna 2' shown in FIG. 3 has substantially ring-shaped antenna waveguides 5a' and 5b', each of which has a substantially rectangular profile in its horizontal cross section. Other constructions of the antenna 2' are the same as those of the antenna 2 in the above-described first preferred embodiment.

The shape of the corner portions of each of the antenna waveguides 5a' and 5b' should not be limited to a circular shape shown in FIG. 3, but it may be a straight chamfered shape (in such a case, the whole profile is substantially octagonal). The shape of the basic profile of each of the antenna waveguides should not be rectangular, but it may be a polygon, such as a pentagon, if it is substantially ring-shaped as a whole.

Fourth Preferred Embodiment

Figure 4A:
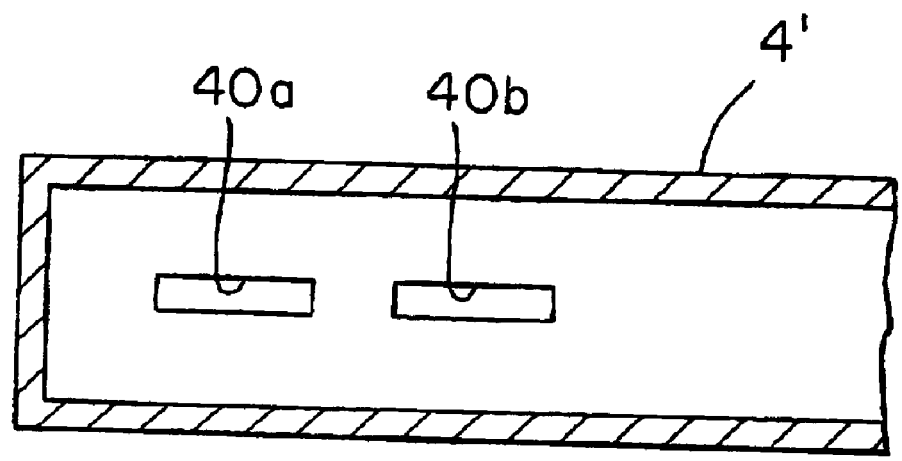
FIG. 4a is a horizontal sectional view of a connecting waveguide, which schematically shows the fourth preferred embodiment of a microwave plasma processing system according to the present invention.
Figure 4B:
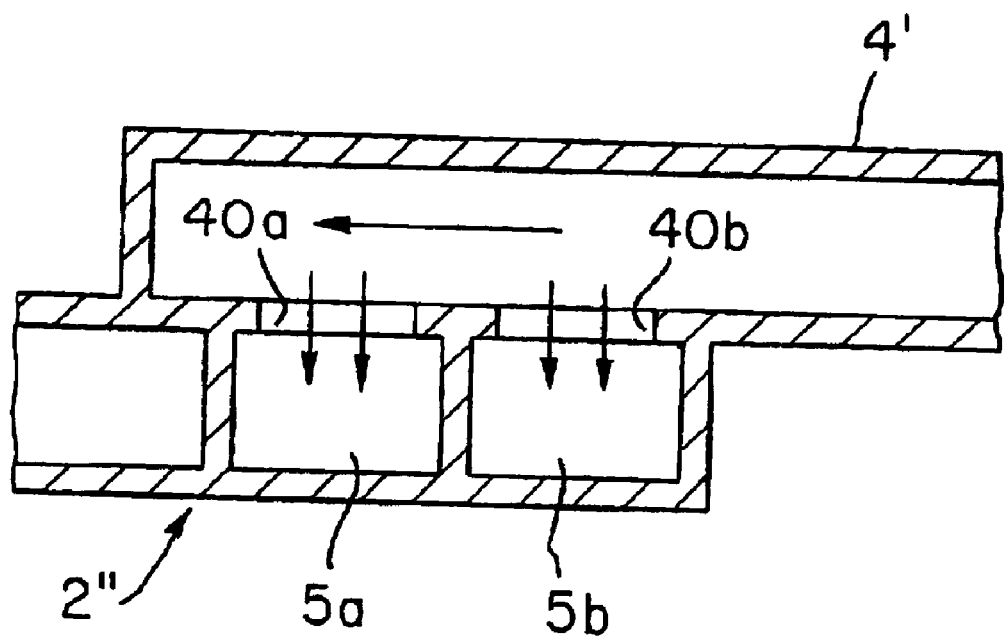
Figure 5:
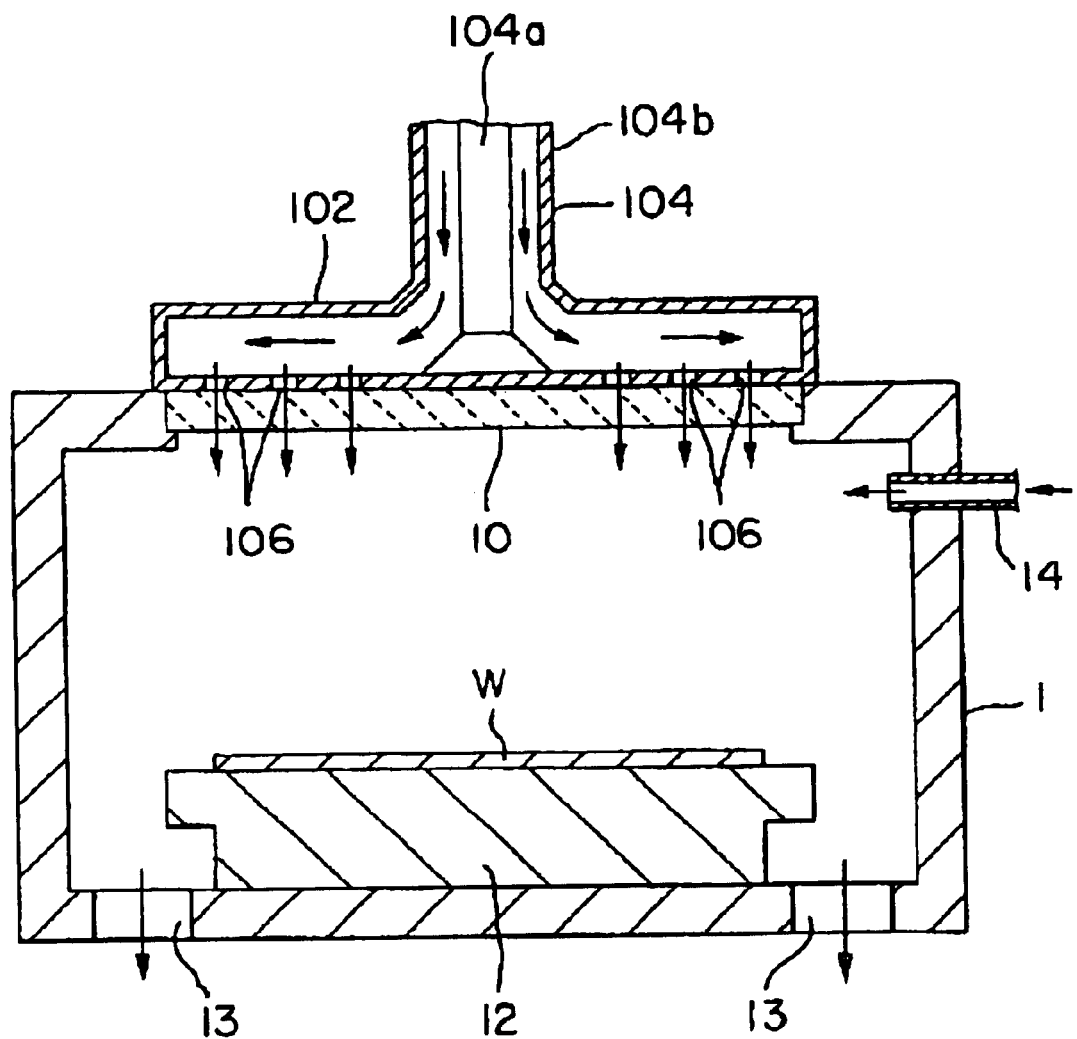
FIG. 5 is a longitudinal sectional view schematically showing a conventional microwave plasma processing system.

Referring to FIGS. 4a and 4b, the fourth preferred embodiment of the present invention will be described below.

This preferred embodiment is substantially the same as the above-described first preferred embodiment, except that an antenna 2" shown in FIGS. 4a and 4b is substituted for the antenna 2 in the above-described first preferred embodiment.

As shown in FIGS. 4a and 4b, in the antenna 2" in this preferred embodiment, a connecting waveguide 4' is provided on the top of each of antenna waveguides 5a and 5b. On the bottom wall (E-plane) of the connecting waveguide 4', slots 40a and 40b corresponding to the respective antenna waveguides 5a and 5b are provided. Microwaves are supplied to the respective antenna waveguides 5a and 5b from the connecting waveguide 4' through the corresponding slots 40a and 40b. Other constructions of the antenna 2" are the same as those of the antenna 2 in the above-described first preferred embodiment.

Other Preferred Embodiments

In the above-described preferred embodiments, while the substantially concentrically arranged antenna waveguides have been arranged so as to be directly adjacent to each other via the side walls of the waveguides, a substantially concentric space may be provided between the antenna waveguides. The traveling direction of microwaves introduced into each of the antenna waveguides should not be limited to the direction in the above-described preferred embodiments, but it may be optionally determined.

In all of the above-described preferred embodiments, a plurality of microwave supply sources corresponding to the respective antenna waveguides may be provided, and waveguides such as rectangular waveguides extending from the respective supply means may be connected to the respective antenna waveguides for independently supplying a power to the respective antenna waveguides.

In the above-described preferred embodiments, an RF bias applying means may be connected to the supporting table 12 (FIG. 1b) for applying an RF bias power thereto. Also, a magnetic field generating means may be provided around the processing vessel 1 (FIG. 1b) for producing plasma by the ECR (Electron Cyclotron Resonance) due to the interaction between a microwave field and a magnetic field.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A microwave plasma processing system comprising:

a processing vessel;

an antenna for introducing microwaves into said processing vessel, the antenna having a plurality of substantially ring-shaped and substantially concentric antenna waveguides, each of said antenna waveguides having a substantially rectangular radial cross-section and comprising a proximal end portion configured to allow flow of the microwaves in only one radial direction, a terminal end portion, and a wall having a plurality of slots formed at a predetermined interval;

a microwave supply source for supplying said microwaves to said antenna; and a connecting waveguide for connecting said microwave supply source to said proximal end portion of each of said antenna waveguides, wherein at least one of the connecting waveguide and the proximal end portions of the antenna waveguides are configured to guide the microwaves supplied from the microwave supply source to the respective one of the antenna waveguides such that the microwaves in each of the antenna waveguides flow in the direction opposite to that of the neighboring antenna waveguide, and wherein a plasma is produced in said processing vessel by said microwaves introduced from said antenna.

2. A microwave plasma processing system comprising:

a processing vessel;

an antenna for introducing microwaves into said processing vessel, the antenna having a plurality of substantially ring-shaped and substantially concentric antenna waveguides, each of said antenna waveguides having a substantially rectangular radial cross-section and comprising a proximal end portion, a terminal end portion, and a wall having a plurality of slots formed at a predetermined interval;

a microwave supply source for supplying said microwaves to said antenna; and a connecting waveguide for connecting said microwave supply source to said proximal end portion of each of said antenna waveguides, wherein a plasma is produced in said processing vessel by said microwaves introduced from said antenna, and wherein at least one of said antenna waveguides of said antenna is provided with aperture variable device for varying the size of an aperture at said proximal end portion.

3. A microwave plasma processing system as set forth in claim 1, wherein said terminal end portion of each of said antenna waveguides of said antenna is closed with a conductor.

4. A microwave plasma processing system as set forth in claim 1, wherein said terminal end portion of each of said antenna waveguides of said antenna is closed with a microwave absorber.

5. A microwave plasma processing system as set forth in claim 1, wherein said connecting waveguide extends to the proximal end portion of innermost one of said antenna waveguides in a substantially radial direction with respect to each of said antenna waveguides.

6. A microwave plasma processing system as set forth in claim 1, wherein a terminal end portion of said connecting waveguide is closed with a conductor.

7. A microwave plasma processing system as set forth in claim 1, wherein a terminal end portion of said connecting waveguide is closed with a microwave absorber.

8. A microwave plasma processing system as set forth in claim 1, wherein the processing vessel comprises a microwave transmittable top wall and the antenna is mounted on the top wall of the processing vessel.

9. A microwave plasma processing system comprising:
- a processing vessel;
- an antenna for introducing microwaves into the processing vessel, having a plurality of substantially ring-shaped antenna waveguides, each of the antenna waveguides comprising a proximal end portion and a terminal end portion;
- a microwave supply source for supplying the microwaves to the antenna; and
- a connecting waveguide for connecting the microwave supply source to each of the antenna waveguides, the connecting waveguide having a closed terminal end portion and a plurality of side apertures associated with the proximal end portions of the antenna waveguides for supplying the microwaves to each of the antenna waveguides,
- wherein at least one of the connecting waveguide and the proximal end portions of the antenna waveguides are configured to guide the microwaves supplied from the microwave supply source to the respective one of the antenna waveguides such that the microwaves in each of the antenna waveguides flow in the direction opposite to that of the neighboring antenna waveguide.

10. A microwave plasma processing system as set forth in claim 9, wherein each of the plurality of apertures is connected to the proximal end portion of each antenna waveguide.

11. A microwave plasma processing system as set forth in claim 9, wherein each of the antenna waveguides has a substantially rectangular radial cross-section and includes a bottom wall having a plurality of slots formed at a predetermined interval.

12. A microwave plasma processing system as set forth in claim 9, wherein the connecting waveguide extends to the proximal end portion of innermost one of the antenna waveguides in a substantially radial direction with respect to each of the antenna waveguides.

13. A microwave plasma processing system as set forth in claim 9, wherein the terminal end portion of each of the antenna waveguides is closed with a conductor.

14. A microwave plasma processing system as set forth in claim 9, wherein the terminal end portion of each of the antenna waveguides is closed with a microwave absorber.

15. An antenna for introducing microwaves in a microwave plasma processing system, comprising:
- a plurality of substantially ring-shaped and substantially concentric antenna waveguides having a substantially rectangular radial cross-section, each of the antenna waveguides comprising:
  - a proximal end portion configured to receive microwaves from a microwave supply source and configured to allow flow of the microwaves in only one radial direction;
  - a terminal end portion; and
  - a wall having a plurality of slots formed at a predetermined interval,
- wherein the proximal end portions of the antenna waveguides are configured to guide the microwaves supplied from the microwave supply source to the respective one of the antenna waveguides such that the microwaves in each of the antenna waveguides flow in the direction opposite to that of the neighboring antenna waveguide.

16. The antenna as set forth in claim 15, wherein at least one of the antenna waveguides comprises an aperture variable device for varying the size of an aperture at the proximal end portion.

17. The antenna as set forth in claim 15, wherein the terminal end portion of each of said antenna waveguides is closed with a conductor.

18. The antenna as set forth in claim 15, wherein the terminal end portion of each of said antenna waveguides is closed with a microwave absorber.

* * * * *